(12) United States Patent
Shih

(10) Patent No.: US 10,950,538 B2
(45) Date of Patent: Mar. 16, 2021

(54) SEMICONDUCTOR STRUCTURE AND MANUFACTURING METHOD THEREOF

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 7 days.

(21) Appl. No.: 16/244,870

(22) Filed: Jan. 10, 2019

(65) Prior Publication Data

US 2020/0168543 A1 May 28, 2020

Related U.S. Application Data

(60) Provisional application No. 62/770,928, filed on Nov. 23, 2018.

(51) Int. Cl.
| | |
|---|---|
| *H01L 23/522* | (2006.01) |
| *H01L 23/31* | (2006.01) |
| *H01L 23/00* | (2006.01) |
| *H01L 21/56* | (2006.01) |
| *H01L 23/528* | (2006.01) |

(52) U.S. Cl.
CPC ........ *H01L 23/5226* (2013.01); *H01L 21/565* (2013.01); *H01L 23/3114* (2013.01); *H01L 23/3128* (2013.01); *H01L 23/5283* (2013.01); *H01L 24/09* (2013.01); *H01L 2924/15311* (2013.01)

(58) Field of Classification Search
CPC ............. H01L 23/5226; H01L 23/3114; H01L 23/3128; H01L 23/5238; H01L 24/09; H01L 21/565; H01L 2924/15311; H01L 2225/1023; H01L 23/15; H01L 23/145; H01L 23/49833; H01L 23/49827; H01L 2224/73251; H01L 2224/06102; H01L 2224/17181; H01L 24/08; H01L 23/13; H01L 23/5283; H01L 2224/81
See application file for complete search history.

(56) References Cited

U.S. PATENT DOCUMENTS

2017/0064835 A1* 3/2017 Ishihara ............... H05K 3/4697

FOREIGN PATENT DOCUMENTS

TW 201807793 A 3/2018

* cited by examiner

*Primary Examiner* — Jasmine J Clark
(74) *Attorney, Agent, or Firm* — Muncy, Geissler, Olds & Lowe, P.C.

(57) ABSTRACT

A semiconductor structure includes a substrate; a die disposed over the substrate; a molding surrounding the die; a dielectric layer disposed over the substrate and surrounding the die and the molding; a conductive via extending through the dielectric layer; and a metallic strip extending through and along the dielectric layer to at least partially surround the die.

13 Claims, 15 Drawing Sheets

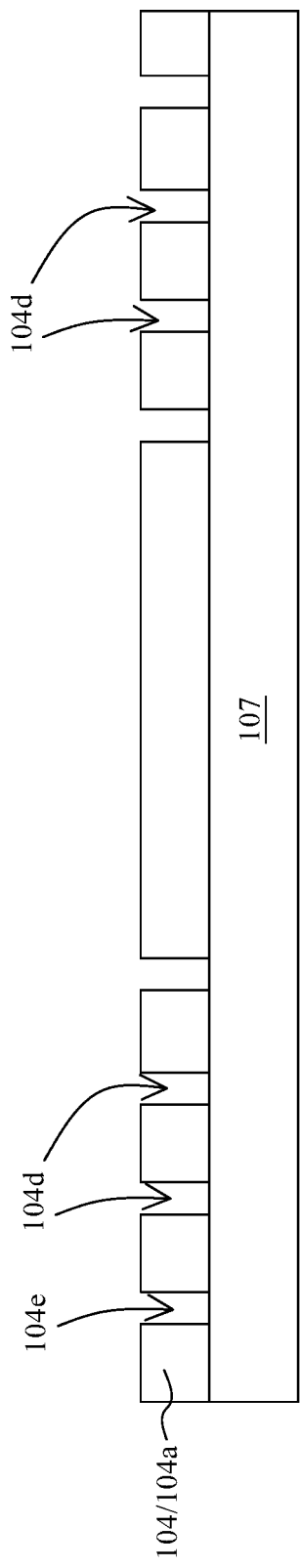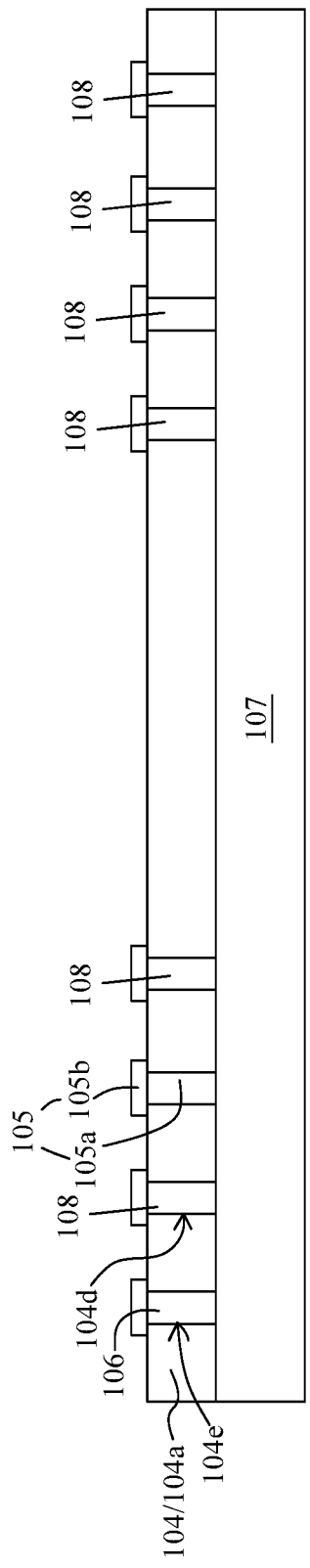

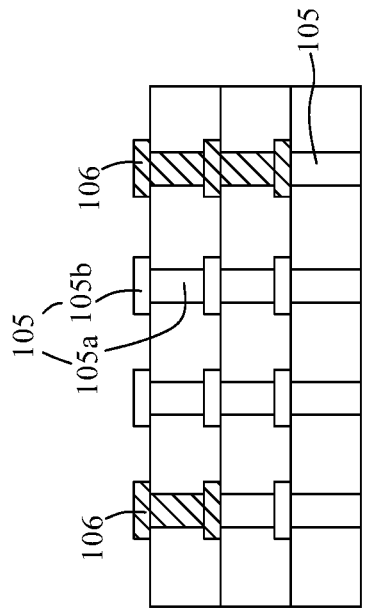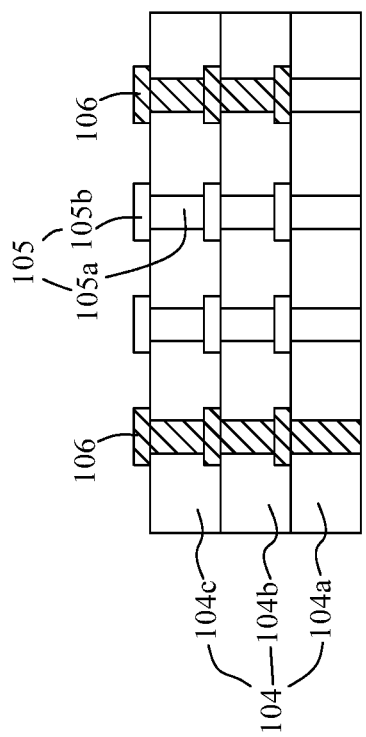
FIG. 12

SEMICONDUCTOR STRUCTURE AND MANUFACTURING METHOD THEREOF

PRIORITY CLAIM AND CROSS-REFERENCE

This application claims the priority benefit of U.S. provisional application Ser. No. 62/770,928 filed on Nov. 23, 2018. The entirety of the above-mentioned patent application is hereby incorporated by reference herein and made a part of this specification.

TECHNICAL FIELD

The present disclosure relates to a semiconductor structure, and particularly relates to a package on package (PoP) structure. In the PoP structure, a package is disposed over another package including a metallic strip. Further, a method of manufacturing a semiconductor structure comprises removing a portion of a dielectric layer of the package to form a trench and disposing a conductive material into the trench to form the metallic strip.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, package on package (PoP) is now widely used as a method for manufacturing the semiconductor devices. Numerous manufacturing steps are undertaken in the production of such package structure.

The manufacturing of semiconductor devices using package on package is becoming more complicated. The semiconductor device is assembled with a number of integrated components including various materials with differences in thermal properties. As many components with different materials are combined, the semiconductor device and its manufacturing operations become more complicated. Accordingly, there is a continuous need to improve the structure and the fabrication of semiconductor devices.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure comprising a substrate; a die disposed over the substrate; a molding surrounding the die; a dielectric layer disposed over the substrate and surrounding the die and the molding; a conductive via extending through the dielectric layer; and a metallic strip extending through and along the dielectric layer to at least partially surround the die.

In some embodiments, the die is enclosed by the metallic strip.

In some embodiments, a surface of the metallic strip is exposed through the dielectric layer.

In some embodiments, the molding is disposed between the die and the dielectric layer.

In some embodiments, the metallic strip is disposed at a corner or along an edge of the semiconductor structure.

In some embodiments, the metallic strip is disposed over the conductive via.

In some embodiments, the conductive via is disposed between the metallic strip and the die.

In some embodiments, the metallic strip is disposed between the die and the conductive via.

In some embodiments, a top cross section of the conductive via is substantially smaller than a top cross section of the metallic strip.

In some embodiments, the top cross section of the conductive via has a circular shape, and the top cross section of the metallic strip has a rectangular shape.

In some embodiments, the semiconductor structure further comprises a first connector disposed under the substrate.

In some embodiments, the semiconductor structure further comprises a package bonded over the die and the dielectric layer by a second connector.

In some embodiments, the second connector is disposed on and electrically connected to the conductive via.

Another aspect of the present disclosure provides a method of manufacturing a semiconductor structure comprising providing a carrier; disposing a dielectric layer over the carrier; removing a first portion of the dielectric layer to form an opening extending through the dielectric layer; removing a second portion of the dielectric layer to form a trench extending through and along the dielectric layer; disposing a conductive material into the opening and the trench to form a conductive via and a metallic strip, respectively; removing a third portion of the dielectric layer; detaching the dielectric layer from the carrier; disposing the dielectric layer over a substrate; disposing a die over the substrate; and forming a molding to surround the die.

In some embodiments, the trench extends along the dielectric layer to at least partially surround the die.

In some embodiments, the removal of the first portion of the dielectric layer and the removal of the second portion of the dielectric layer are performed simultaneously.

In some embodiments, the removal of the third portion of the dielectric layer is performed prior to the detachment of the dielectric layer from the carrier or after the disposing of the dielectric layer over the substrate.

In some embodiments, the disposing of the dielectric layer over the substrate includes bonding the dielectric layer over the substrate by a connector.

In some embodiments, the conductive material is disposed by electroplating, physical vapor deposition (PVD), chemical vapor deposition (CVD) or stencil plating.

In some embodiments, the method further comprises bonding a package over the die and the dielectric layer by a connector.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIGS. 6 to 17 are schematic views of a process of manufacturing the semiconductor structure by the method of FIG. 5 in accordance with some embodiments of the present disclosure.

DETAILED DESCRIPTION

Figure 1:
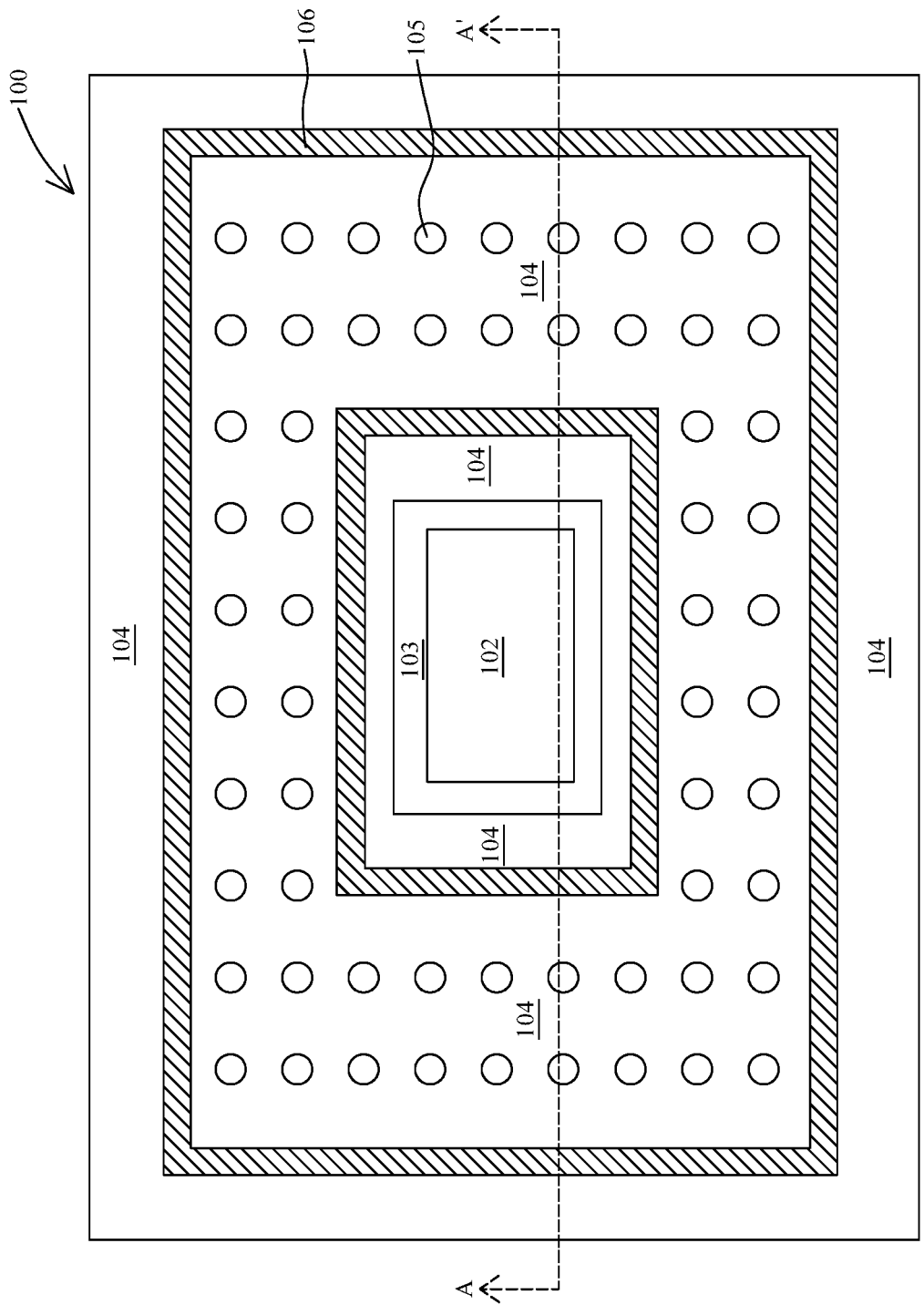
FIG. 1 is a schematic top view of a semiconductor structure in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor structure comprising a metallic strip at least partially surrounding a die. In addition, the present disclosure is directed to a method of manufacturing a semiconductor structure comprising removing a portion of a dielectric layer to form a trench and disposing a conductive material into the trench to form a metallic strip. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

A semiconductor structure is manufactured by several processes. A die or chip is disposed over a substrate to become a first package, and then a second package is bonded over the first package to form a package on package (PoP) structure. However, improving technologies are causing a dimension of such packages to become smaller and thinner. Such a small and thin package can easily suffer from warpage or bending, and thus some of connectors on the first package may not be able to contact corresponding connectors on the second package. Cold-joint defects may occur and cause failure of the electrical connection between the first package and the second package. Reliability of the semiconductor structure is thus decreased.

In the present disclosure, a semiconductor structure is disclosed. The semiconductor structure comprises a substrate, a dielectric layer disposed over the substrate, and a metallic strip extending through and along the dielectric layer. The metallic strip can strengthen the semiconductor structure and thus prevent or minimize warpage of the semiconductor structure. As such, reliability of the semiconductor structure can be improved.

Furthermore, reduction or prevention of warpage of the semiconductor structure can improve bonding between the semiconductor structure and another package. Cold-joint defects between the semiconductor structure and another package can be reduced or prevented. Accordingly, electrical connection between the semiconductor structure and another package is also improved.

Figure 2:
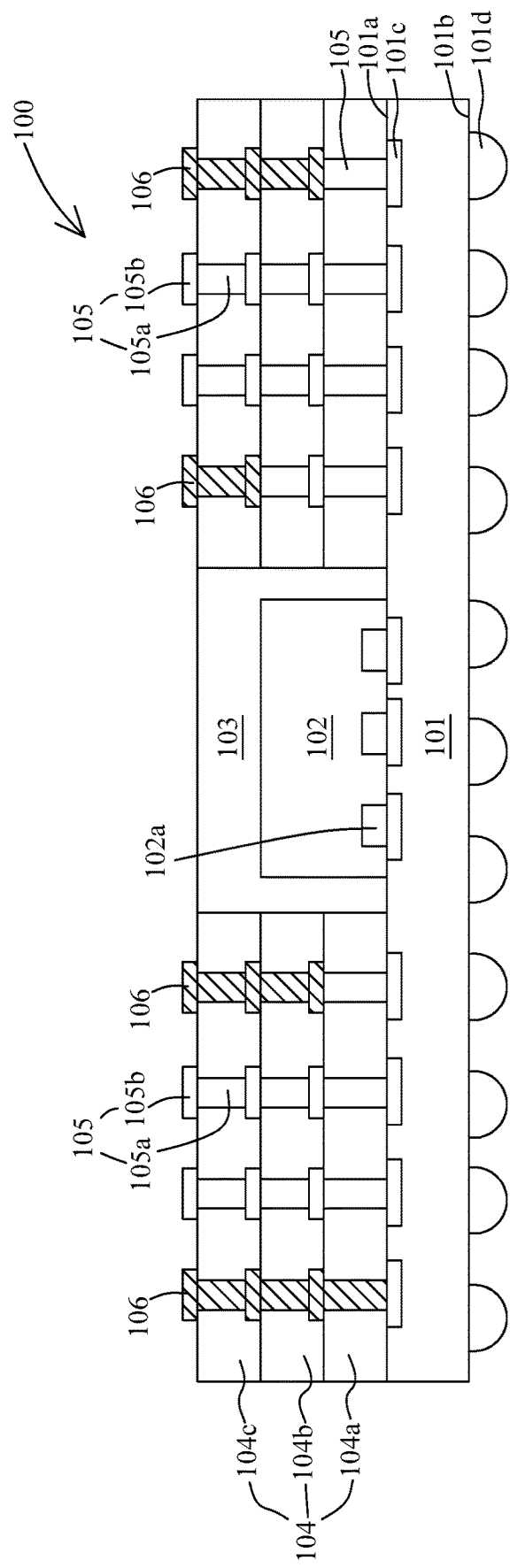
FIG. 2 is a schematic cross-sectional view of the semiconductor structure of FIG. 1 along a line AA' of FIG. 1.

FIG. 1 is a top view of a semiconductor structure 100, and FIG. 2 is a cross-sectional view of the semiconductor structure 100 along a line AA' of FIG. 1, in accordance with some embodiments of the present disclosure. In some embodiments, the semiconductor structure 100 includes a substrate 101, a die 102, a molding 103, a dielectric layer 104, a conductive via 105 and a metallic strip 106.

In some embodiments, the semiconductor structure 100 is a semiconductor package or a part of the semiconductor package. In some embodiments, the semiconductor structure 100 is a flip chip package.

In some embodiments, the substrate 101 is a semiconductive substrate. In some embodiments, the substrate 101 is a wafer or an interposer. In some embodiments, the substrate 101 includes semiconductive material such as silicon, germanium, gallium, arsenic, and combinations thereof. In some embodiments, the substrate 101 includes material such as ceramic, glass or the like. In some embodiments, the substrate 101 is a silicon substrate. In some embodiments, the substrate 101 is a packaging substrate. In some embodiments, the substrate 101 has a quadrilateral, rectangular, square, polygonal or any other suitable shape.

In some embodiments, the substrate 101 is fabricated with a predetermined functional circuit thereon. The substrate 101 includes several conductive traces and several electrical components such as a transistor, a diode, etc. disposed within the substrate 101. In some embodiments, the substrate 101 includes a first surface 101a and a second surface 101b opposite to the first surface 101a.

In some embodiments, a first conductive pad 101c is disposed over or within the substrate 101. In some embodiments, the first conductive pad 101c is disposed over the first surface 101a of the substrate 101. In some embodiments, the first conductive pad 101c is electrically connected to a circuitry or an electrical component in the is substrate 101. In some embodiments, the first conductive pad 101c is electrically connected to a circuitry external to the substrate 101, so that the circuitry in the substrate 101 can electrically connect to the circuitry external to the substrate 101 through the first conductive pad 101c.

In some embodiments, the first conductive pad 101c is configured to receive a conductive structure. In some embodiments, the first conductive pad 101c is a die pad or a bond pad. In some embodiments, the first conductive pad 101c includes gold, silver, copper, nickel, tungsten, aluminum, palladium or alloys thereof.

In some embodiments, a first connector 101d is disposed over the substrate 101. In some embodiments, the first connector 101d is disposed over the second surface 101b of the substrate 101. In some embodiments, the first connector 101d is disposed under the substrate 101. In some embodiments, the first connector 101d includes conductive material such as solder, copper, nickel, or gold. In some embodiments, the first connector 101d is a solder ball, a ball grid array (BGA) ball, a controlled collapse chip connection (C4) bump, a microbump, a pillar or the like. In some embodiments, the first connector 101d has a spherical, hemispherical or cylindrical shape.

In some embodiments, the die 102 is disposed over the substrate 101. In some embodiments, the die 102 is disposed over the first surface 101a of the substrate 101. In some embodiments, the die 102 is electrically connected to the substrate 101. In some embodiments, the die 102 is flipped, and a die pad 102a is bonded to the first conductive pad 101c of the substrate 101 to electrically connect the die 102 to the substrate 101.

In some embodiments, the die 102 is fabricated with a predetermined functional circuit within the die 102. The die 102 comprises various devices such as transistors, capacitors, resistors, diodes or the like. In some embodiments, the die 102 is a logic device die or the like. In some embodiments, the die 102 is singulated from a semiconductive wafer by a mechanical or laser blade. Although FIGS. 1 and 2 illustrate the semiconductor structure 100 as including only one die 102, it should be understood that the semiconductor structure 100 can include more than one die 102. It is not intended to limit a number of dies in the semiconductor structure 100.

In some embodiments, the die 102 is surrounded by the molding 103. The die 102 is encapsulated by the molding 103. In some embodiments, the molding 103 is disposed over the substrate 101. In some embodiments, all sidewalls of the die 102 are covered by the molding 103. In some embodiments, a surface of the molding 103 is exposed through the dielectric layer 104. In some embodiments, the molding 103 can be a single-layer film or a composite stack. In some embodiments, the molding 103 includes various materials, such as molding compound, liquid molding compound, molding underfill, epoxy, resin, or the like. In some embodiments, the molding 103 has a high thermal conductivity, a low moisture absorption rate and a high flexural strength.

In some embodiments, the dielectric layer 104 is disposed over the substrate 101. In some embodiments, the dielectric layer 104 is disposed over the first surface 101a of the substrate 101. In some embodiments, the dielectric layer 104 surrounds the die 102 and the molding 103. The molding 103 is disposed between the die 102 and the dielectric layer 104.

In some embodiments, the dielectric layer 104 includes several layers (104a, 104b, 104c) stacked over each other. In some embodiments, the dielectric layer 104 includes dielectric or polymeric material. In some embodiments, the dielectric layer 104 includes polymer, polyimide (PI), silicon oxide, silicon nitride or the like. In some embodiments, the dielectric layer 104 includes a first layer 104a, a second layer 104b over the first layer 104a, and a third layer 104c over the first layer 104a and the second layer 104b. In some embodiments, the first layer 104a, the second layer 104b and the third layer 104c all comprise a same material, or comprise different materials.

In some embodiments, the conductive via 105 extends through the dielectric layer 104. In some embodiments, the conductive via 105 extends through at least one of the first layer 104a, the second layer 104b and the third layer 104c of the dielectric layer 104. In some embodiments, the conductive via 105 includes conductive material such as copper, silver, gold, aluminum, etc. In some embodiments, the conductive via 105 has a cylindrical shape. In some embodiments, a top cross section of the conductive via 105 has a circular, rectangular or polygonal shape. In some embodiments, the semiconductor structure 100 includes several conductive vias 105 arranged in a regular array.

In some embodiments, the conductive via 105 includes a via portion 105a and a pad portion 105b. The via portion 105a extends through at least one of the first layer 104a, the second layer 104b and the third layer 104c of the dielectric layer 104. In some embodiments, the via portion 105a extends vertically in the dielectric layer 104. In some embodiments, the pad portion 105a is disposed on or under the via portion 105a and extends over at least one of the first layer 104a, the second layer 104b and the third layer 104c of the dielectric layer 104. In some embodiments, the pad portion 105b is exposed through the dielectric layer 104.

In some embodiments, the metallic strip 106 extends through and along the dielectric layer 104 to at least partially surround the die 102. In some embodiments, the metallic strip 106 extends vertically in the dielectric layer 104. In some embodiments, the metallic strip 106 extends vertically through at least one of the first layer 104a, the second layer 104b and the third layer 104c of the dielectric layer 104. In some embodiments, the metallic strip 106 extends from the first surface 101a of the substrate 101 to the first layer 104a, the second layer 104b or the third layer 104c. In some embodiments, the metallic strip 106 extends from the second layer 104b to the third layer 104c.

In some embodiments, the metallic strip 106 extends along the dielectric layer 104 and along an edge of the semiconductor structure 100. In some embodiments, the metallic strip 106 extends parallel to the first surface 101a of the substrate 101. In some embodiments, the metallic strip 106 extends horizontally within the dielectric layer 104. In some embodiments, the metallic strip 106 is disposed over the conductive via 105. In some embodiments, the metallic strip 106 is disposed above and vertically aligned with the conductive via 105.

In some embodiments, the conductive via 105 is disposed between the metallic strip 106 and the die 102. In some embodiments, the metallic strip 106 at least partially surrounds the conductive via 105, the die 102 and the molding 103. In some embodiments, the metallic strip 106 is disposed between the die 102 and the conductive via 105. In some embodiments, the metallic strip 106 at least partially surrounds the die 102 and the molding 103. In some embodiments, the die 102 and the molding 103 are enclosed by the metallic strip 106.

In some embodiments, a top cross section of the metallic strip 106 has a rectangular shape. In some embodiments, the metallic strip 106 is configured as a frame to at least partially surround the die 102. In some embodiments, the metallic strip 106 is configured as an enclosed frame. In some embodiments, the top cross section of the conductive via 105 is substantially smaller than the top cross section of the metallic strip 106. In some embodiments, a surface of the metallic strip 106 is exposed through the dielectric layer 104. In some embodiments, the metallic strip 106 is connected to an electrical ground.

Figure 3:
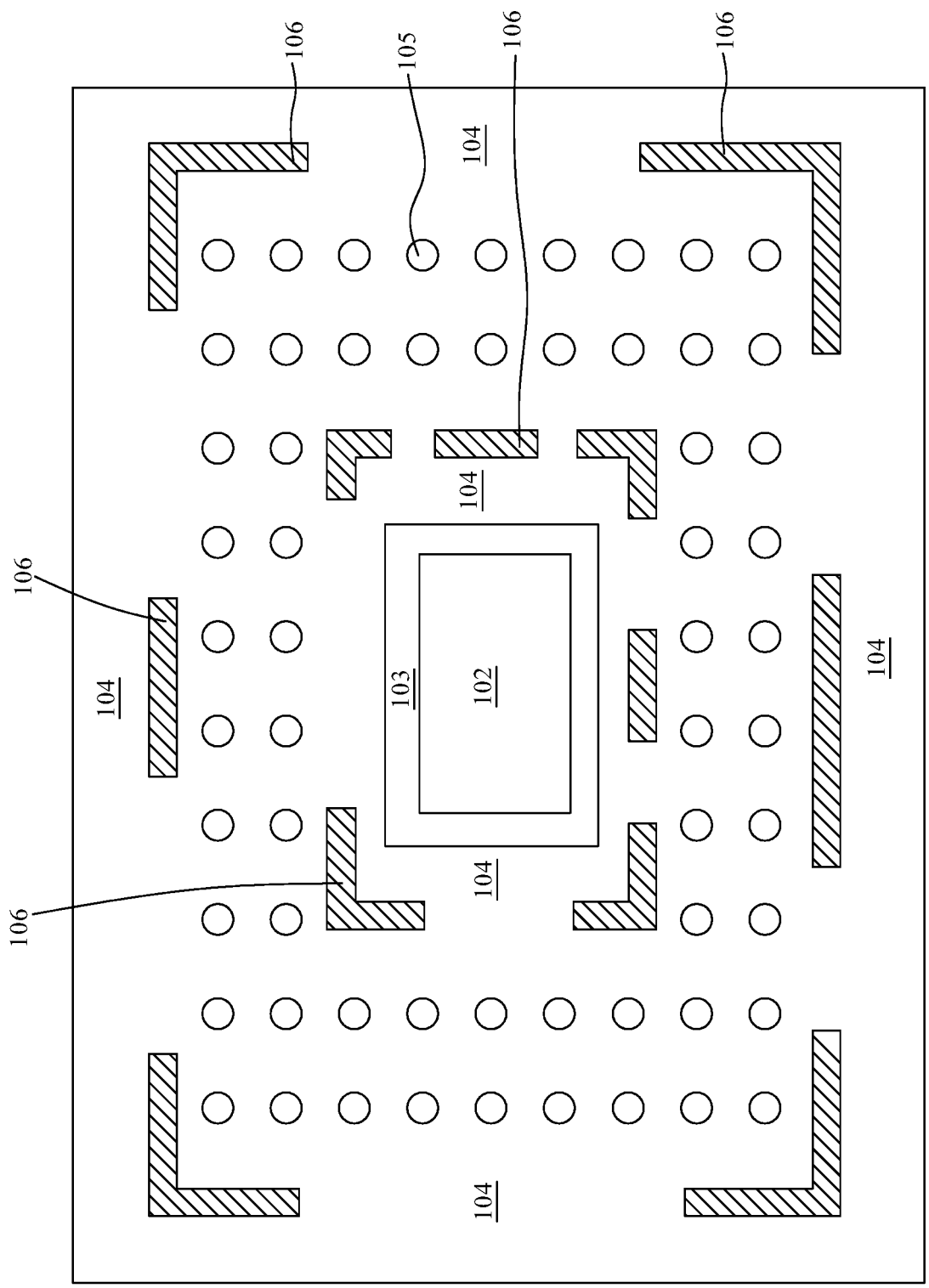
FIG. 3 is another schematic top view of a semiconductor structure in accordance with some embodiments of the present disclosure.

FIG. 3 is a top view of the semiconductor structure 100 illustrating the metallic strip 106 in another configuration. In some embodiments, the metallic strip 106 includes several segments, and each segment at least partially surrounds the die 102 or extends along the edge of the semiconductor structure 100. In some embodiments, the segment of the metallic strip 106 is disposed at a corner of the semiconductor structure 100. In some embodiments, the segment of the metallic strip 106 is disposed adjacent to a corner of the die 102. In some embodiments, the segment of the metallic strip 106 is disposed adjacent to and extending along an edge of the die 102.

In some embodiments, a top cross section of a segment of the metallic strip 106 has a rectangular or an L shape. In some embodiments, the top cross section of the conductive via 105 is substantially smaller than the top cross section of the segment of the metallic strip 106.

Figure 4:
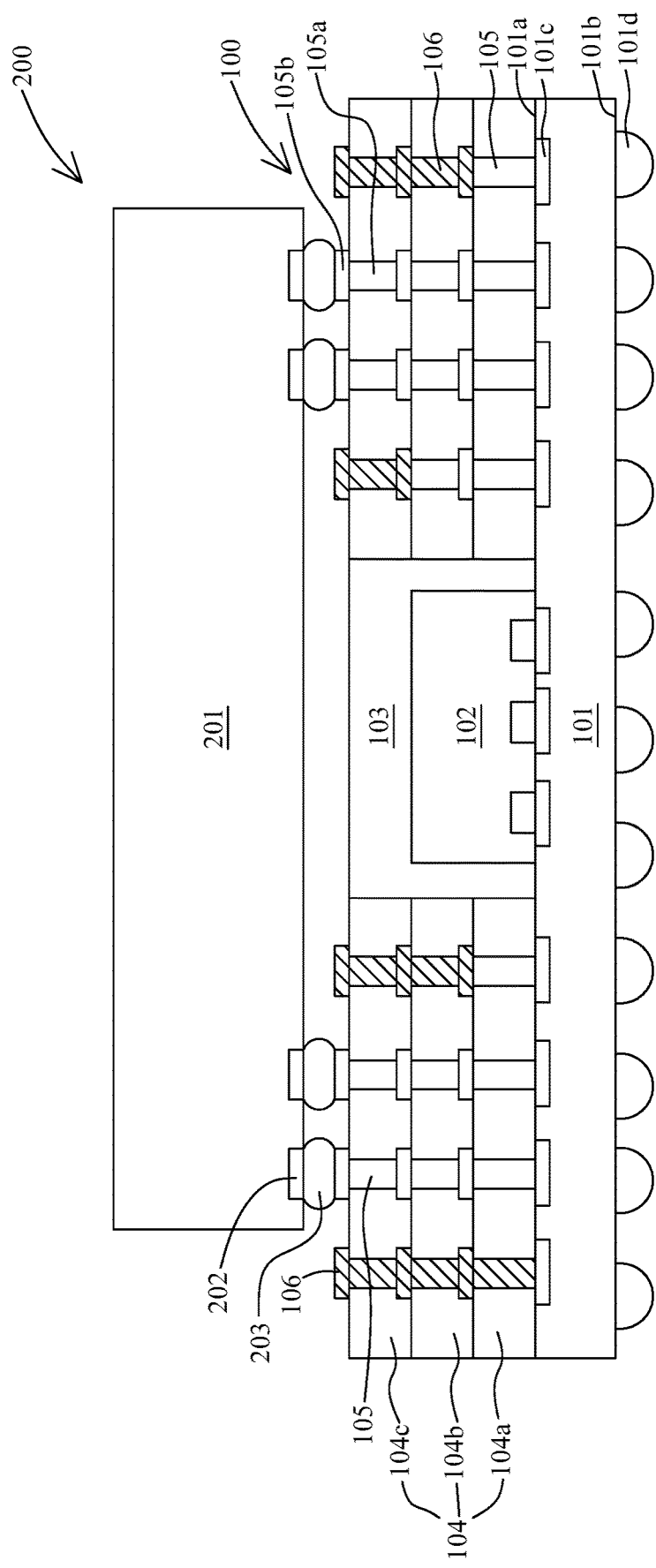
FIG. 4 is a schematic cross-sectional view of a semiconductor structure in accordance with some embodiments of the present disclosure.

FIG. 4 is a cross-sectional view of a package on package (PoP) structure 200 in accordance with some embodiments of the present disclosure. In some embodiments, the PoP structure 200 includes the semiconductor structure 100 as described above or shown in any of FIGS. 1 to 3.

In some embodiments, the PoP structure 200 includes a package substrate 201 disposed over and electrically connected to the semiconductor structure 100. In some embodiments, the package substrate 201 is flipped and bonded to the semiconductor structure 100. In some embodiments, the package substrate 201 is a wafer or an interposer. In some embodiments, the package substrate 201 includes semiconductive material such as silicon, germanium, gallium, arsenic, and combinations thereof. In some embodiments, the package substrate 201 includes material such as ceramic, glass or the like. In some embodiments, the package substrate 201 has a quadrilateral, rectangular, square, polygonal or any other suitable shape.

In some embodiments, the package substrate 201 is fabricated with a predetermined functional circuit thereon. In some embodiments, the package substrate 201 includes several conductive traces and several electrical components such as transistors, diodes, etc. disposed within the package substrate 201.

In some embodiments, a second conductive pad 202 is disposed over or within the package substrate 201. In some embodiments, the second conductive pad 202 is electrically connected to a circuitry or an electrical component in the package substrate 201. In some embodiments, the second conductive pad 202 is electrically connected to a circuitry external to the package substrate 201, so that the circuitry in the package substrate 201 can electrically connect to the circuitry external to the package substrate 201 through the second conductive pad 202.

In some embodiments, the second conductive pad 202 is configured to receive a conductive structure. In some embodiments, the second conductive pad 202 is a die pad or a bond pad. In some embodiments, the second conductive pad 202 includes gold, silver, copper, nickel, tungsten, aluminum, palladium or alloys thereof.

In some embodiments, a second connector 203 is disposed over the package substrate 201. In some embodiments, the second connector 203 includes conductive material such as solder, copper, nickel, or gold. In some embodiments, the second connector 203 is a solder ball, a ball grid array (BGA) ball, a controlled collapse chip connection (C4) bump, a microbump, a pillar or the like. In some embodiments, the second connector 203 has a spherical, hemispherical or cylindrical shape.

In some embodiments, the package substrate 201 is bonded over the die 102 and the dielectric layer 104 by the second connector 203. In some embodiments, the second connector 203 is disposed on and electrically connected to the conductive via 105. In some embodiments, the second connector 203 is bonded to the pad portion 105b of the conductive via 105. In some embodiments, the metallic strip 106 is electrically isolated from the package substrate 201, the second conductive pad 202 and the second connector 203.

Figure 5:
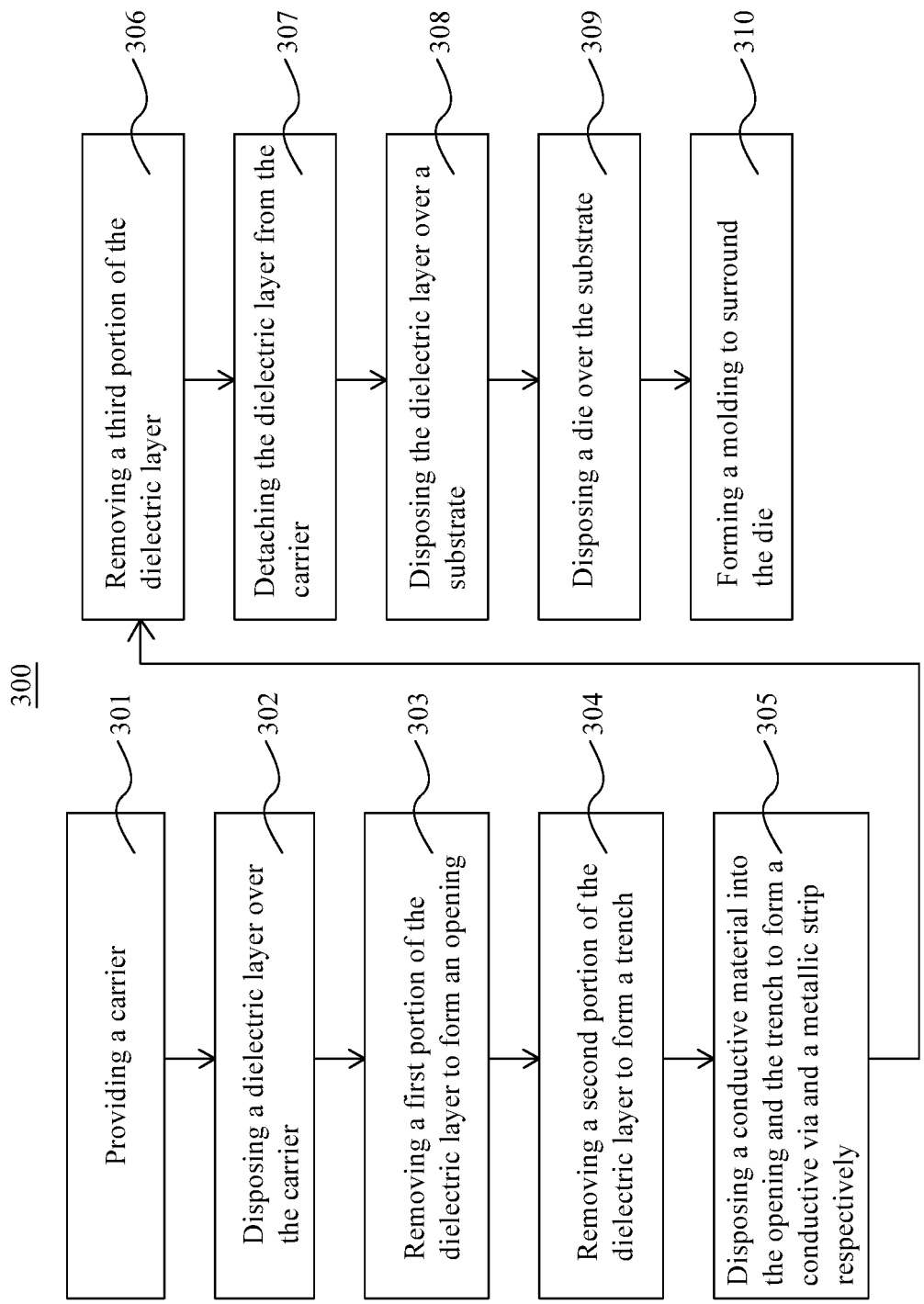
FIG. 5 is a flowchart of a method of manufacturing a semiconductor structure in accordance with some embodiments of the present disclosure.

In the present disclosure, a method of manufacturing a semiconductor structure (100, 200) is also disclosed. In some embodiments, the semiconductor structure (100, 200) can be formed by a method 300 of FIG. 5. The method 300 includes a number of operations and the description and illustration are not deemed as a limitation to the sequence of the operations. The method 300 includes a number of steps (301, 302, 303, 304, 305, 306, 307, 308, 309 and 310).

Figure 6:
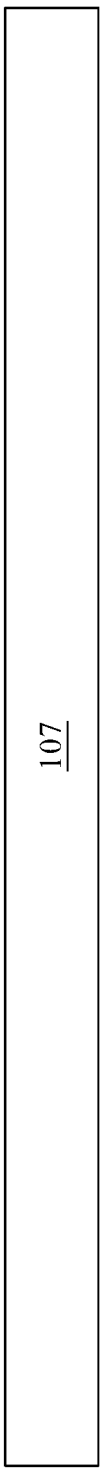

In step 301, a carrier 107 is provided or received as shown in FIG. 6. In some embodiments, the carrier 107 is made of semiconductive material. In some embodiments, the carrier 107 includes silicon, germanium, gallium, arsenic, or combinations thereof. In some embodiments, the carrier 107 is made of glass or the like. In some embodiments, the carrier 107 has a quadrilateral, rectangular, square, polygonal or any other suitable shape.

Figure 7:
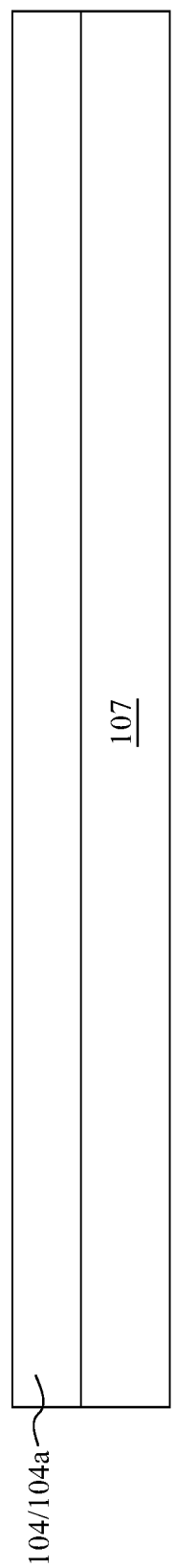

In step 302, a dielectric layer 104 is disposed over the carrier 107 as shown in FIG. 7. In some embodiments, the dielectric layer 104 is disposed by spin coating, chemical vapor deposition (CVD) or any other suitable operation. In some embodiments, a first layer 104a of the dielectric layer 104 is disposed over the carrier 107.

In step 303, a first portion of the dielectric layer 104 is removed to form an opening 104d as shown in FIG. 8. In some embodiments, the first portion of the dielectric layer 104 is removed by photolithography, etching, laser drilling or any other suitable operation. In some embodiments, the opening 104d extends through the first layer 104a of the dielectric layer 104. In some embodiments, a top cross section of the opening 104d has a circular shape.

In step 304, a second portion of the dielectric layer 104 is removed to form a trench 104e as shown in FIG. 8. In some embodiments, the second portion of the dielectric layer 104 is removed by photolithography, etching, laser drilling or any other suitable operation. In some embodiments, the trench 104e extends through and along the first layer 104a of the dielectric layer 104. In some embodiments, a top cross section of the trench 104e has a rectangular shape.

In some embodiments, the removal of the first portion of the dielectric layer 104 (the step 303) and the removal of the second portion of the dielectric layer 104 (the step 304) are performed simultaneously or separately. In some embodiments, the step 303 is performed prior to or after the step 304.

In step 305, conductive material 108 is disposed into the opening 104d and the trench 104e to form a conductive via 105 and a metallic strip 106, respectively, as shown in FIG. 9. In some embodiments, the conductive material 108 is disposed by plating, electroplating, sputtering, physical vapor deposition (PVD), chemical vapor deposition (CVD), stencil plating or any other suitable operation. In some embodiments, the disposing of the conductive material 108 into the opening 104d and the disposing of the conductive material 108 into the trench 104e are performed simultaneously or separately.

In some embodiments, the conductive material 108 is disposed into the opening 104d to form a via portion 105a of the conductive via 105. In some embodiments, the conductive material 108 is disposed over the dielectric layer 104 to form a pad portion 105b of the conductive via 105.

In some embodiments, the disposing of the conductive material 108 is performed after the removal of the first portion of the dielectric layer 104 (the step 303) but prior to the removal of the second portion of the dielectric layer 104 (the step 304). In other words, the conductive via 105 is formed prior to the step 304. In some embodiments, the disposing of the conductive material 108 is performed after the removal of the second portion of the dielectric layer 104 (the step 304) but prior to the removal of the first portion of the dielectric layer 104 (the step 303). In other words, the metallic strip 106 is formed prior to the step 303.

Figure 10:
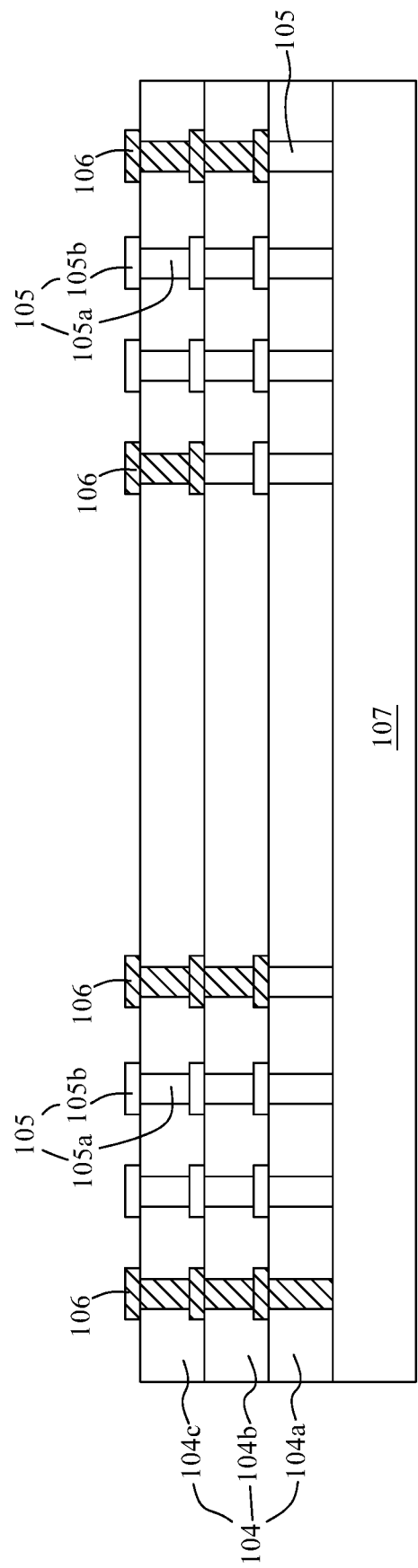

In some embodiments, the step 302, the step 303, the step 304 and the step 305 are repeatedly performed in order to form an intermediate structure as shown in FIG. 10.

In some embodiments, after the step 305, a second layer 104b of the dielectric layer 104 is disposed over the first layer 104a of the dielectric layer 104, the first portion or the second portion of the dielectric layer 104 is removed, and the conductive material 108 is disposed into the opening 104d to form the conductive via 105 or disposed into the trench 104e to form the metallic strip 106.

In some embodiments, after the disposing of the second layer 104b of the dielectric layer 104 and the formation of the conductive via 105 or the metallic strip 106 in the second layer 104b, a third layer 104c of the dielectric layer 104 is disposed over the second layer 104b of the dielectric layer 104, and then the first portion or the second portion of the dielectric layer 104 is removed, and then the conductive material 108 is disposed into the opening 104d to form the conductive via 105 or disposed into the trench 104e to form the metallic strip 106.

Figure 11:
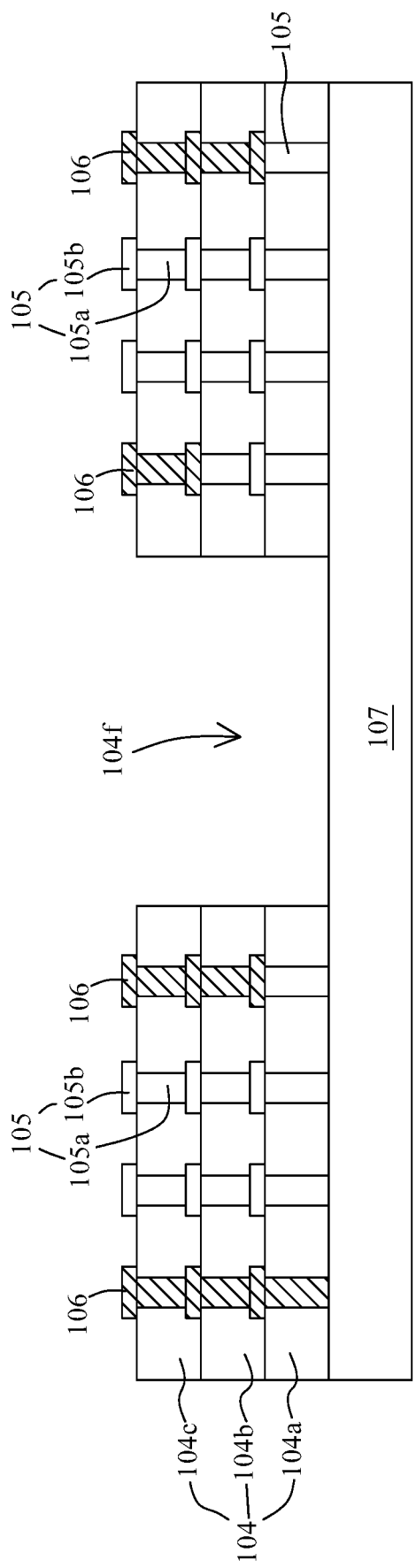

In step 306, a third portion of the dielectric layer 104 is removed as shown in FIG. 11. In some embodiments, the third portion of the dielectric layer 104 is removed by photolithography, etching, laser drilling or any other suitable operation. In some embodiments, a hole 104f is formed after the removal of the third portion of the dielectric layer 104. In some embodiments, the hole 104f extends through the dielectric layer 104. In some embodiments, the hole 104f extends through the first layer 104a, the second layer 104b and the third layer 104c of the dielectric layer 104. In some embodiments, the dielectric layer 104, the conductive via 105 and the metallic strip 106 are in configurations as described above or as shown in FIGS. 1 to 4.

In step 307, the dielectric layer 104 is detached from the carrier 107 as shown in FIG. 12. The carrier 107 is detached by any suitable debonding operations. In some embodiments, a connector such as a pad, a bump, a pillar, etc. is disposed over an end of the conductive via 105 or over an end of the metallic strip 106. The connector is configured to bond with a conductive structure.

Figure 13:
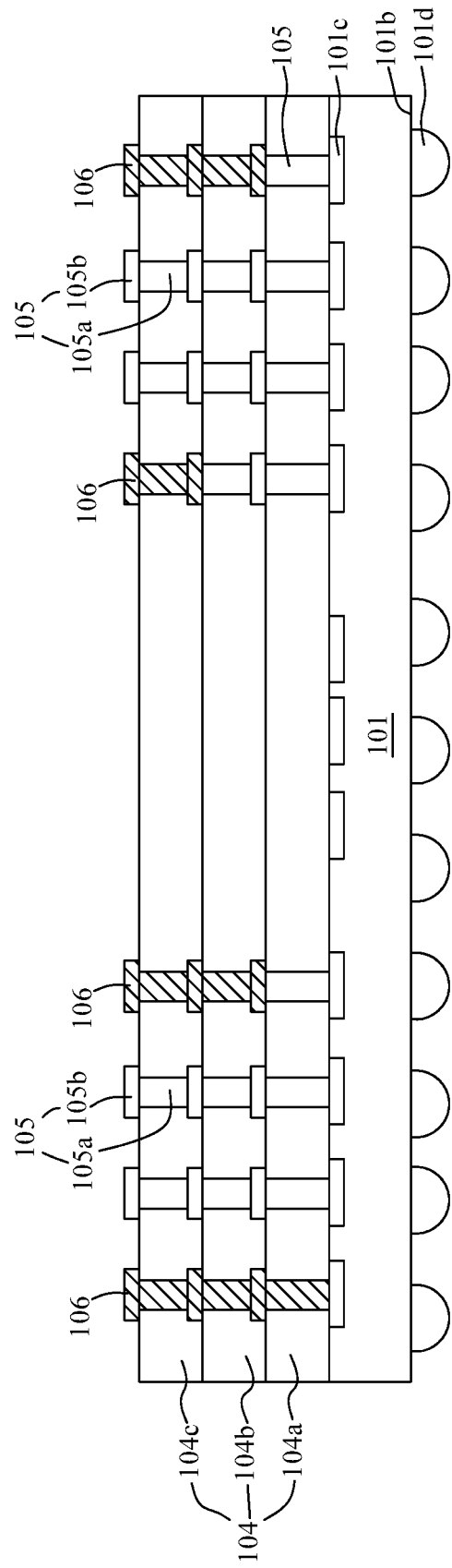
Figure 14:
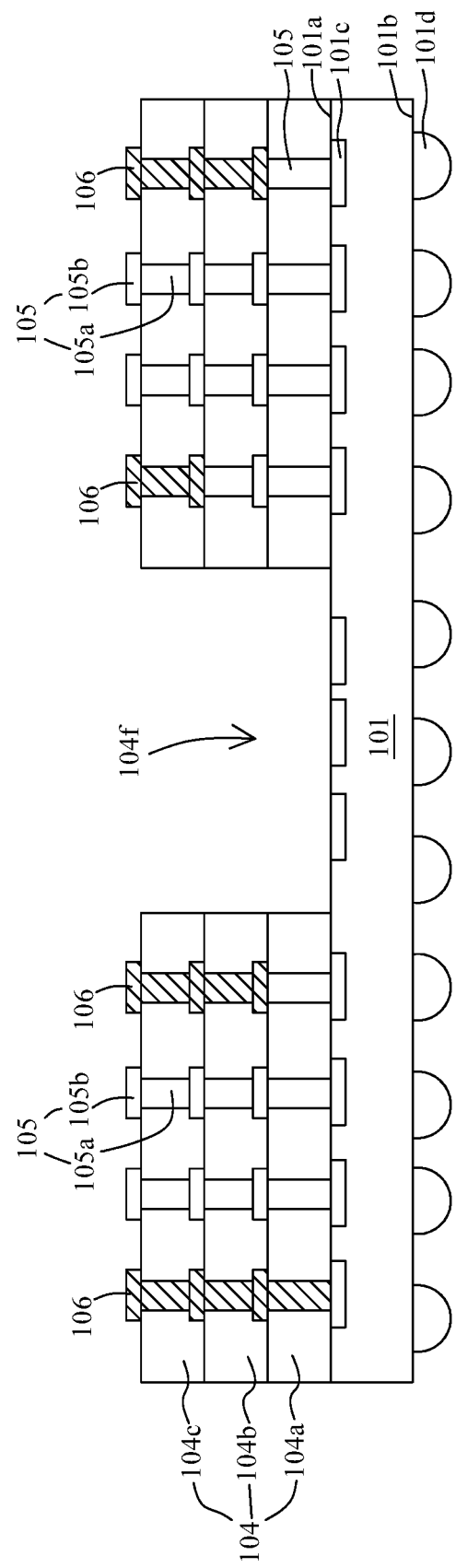

In step 308, the dielectric layer 104 detached from the carrier 107 is disposed over a substrate 101 as shown in FIGS. 13 and 14. In some embodiments, the dielectric layer 104 is bonded over the substrate 101. In some embodiments, the dielectric layer 104 is vertically aligned with the substrate 101. In some embodiments, the conductive via 105 and the metallic strip 106 are disposed over a first conductive pad 101c of the substrate 101. In some embodiments, the substrate 101 is in configurations as described above or as shown in FIGS. 1 to 4.

In some embodiments, the conductive via 105 is electrically connected to the substrate 101 through the first conductive pad 101c. In some embodiments, the metallic strip 106 is not electrically connected to the substrate 101. In some embodiments, the connector such as a pad, a bump, a pillar, etc. bonds the dielectric layer 104 to the substrate 101. The connector is disposed between the conductive via 105 and the first conductive pad 101c. The connector is bonded to the first conductive pad 101c.

In some embodiments, the removal of the third portion of the dielectric layer 104 (the step 306) is performed after the detaching of the dielectric layer 104 from the carrier (the step 307) and the disposing of the dielectric layer 104 over the substrate 101 (the step 308). As shown in FIG. 13, the dielectric layer 104 is detached from the carrier 107 and then disposed over the substrate 101. After the disposing of the dielectric layer 104 over the substrate 101, the third portion of the dielectric layer 104 is removed to form the hole 104f as shown in FIG. 14.

Figure 15:
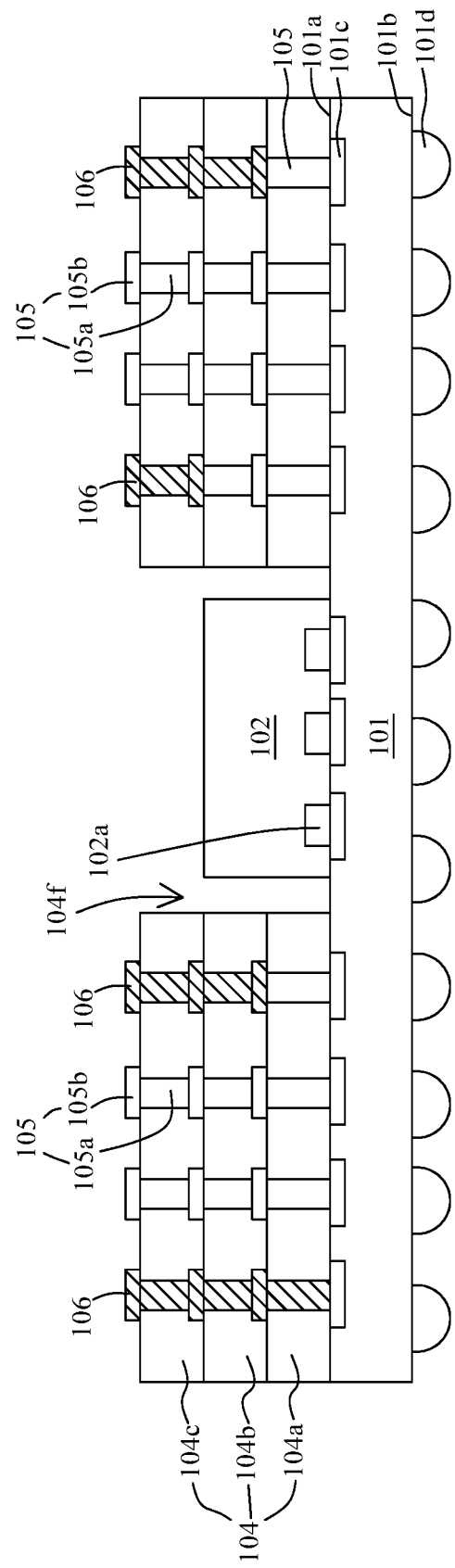

In step 309, a die 102 is disposed over the substrate 101 as shown in FIG. 15. The die 102 is flipped and bonded to the substrate. In some embodiments, a die pad 102a of the die 102 is bonded to the first conductive pad 101c of the substrate 101. The die 102 is electrically connected to the substrate 101. In some embodiments, the metallic strip 106 at least partially surrounds the die 102. In some embodiments, the trench 104e at least partially surrounds the die 102. In some embodiments, the die 102 is in configurations as described above or as shown in FIGS. 1 to 4.

Figure 16:
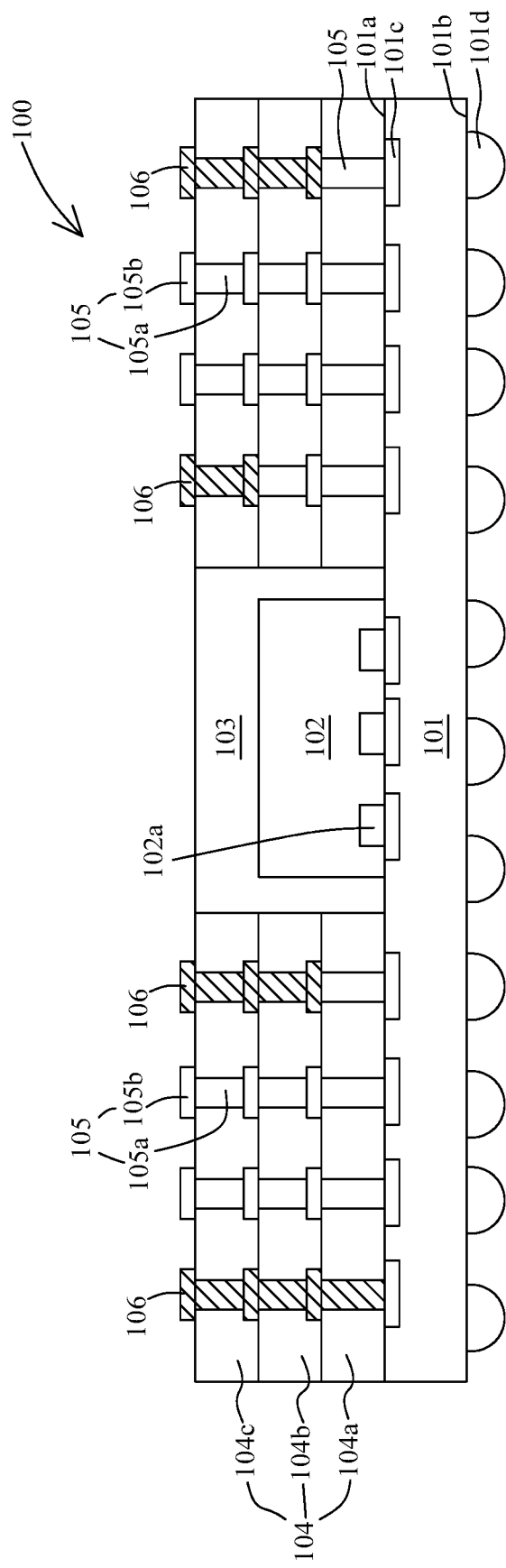

In step 310, a molding 103 is formed to surround the die 102 as shown in FIG. 16. In some embodiments, the molding 103 is formed by transfer molding, injection molding or any other suitable operation. In some embodiments, the molding 103 covers the die 102 and is surrounded by the dielectric layer 104. In some embodiments, the molding 103 is in configurations as described above or as shown in FIGS. 1 to 4. In some embodiments, a semiconductor structure 100 is formed.

Figure 17:
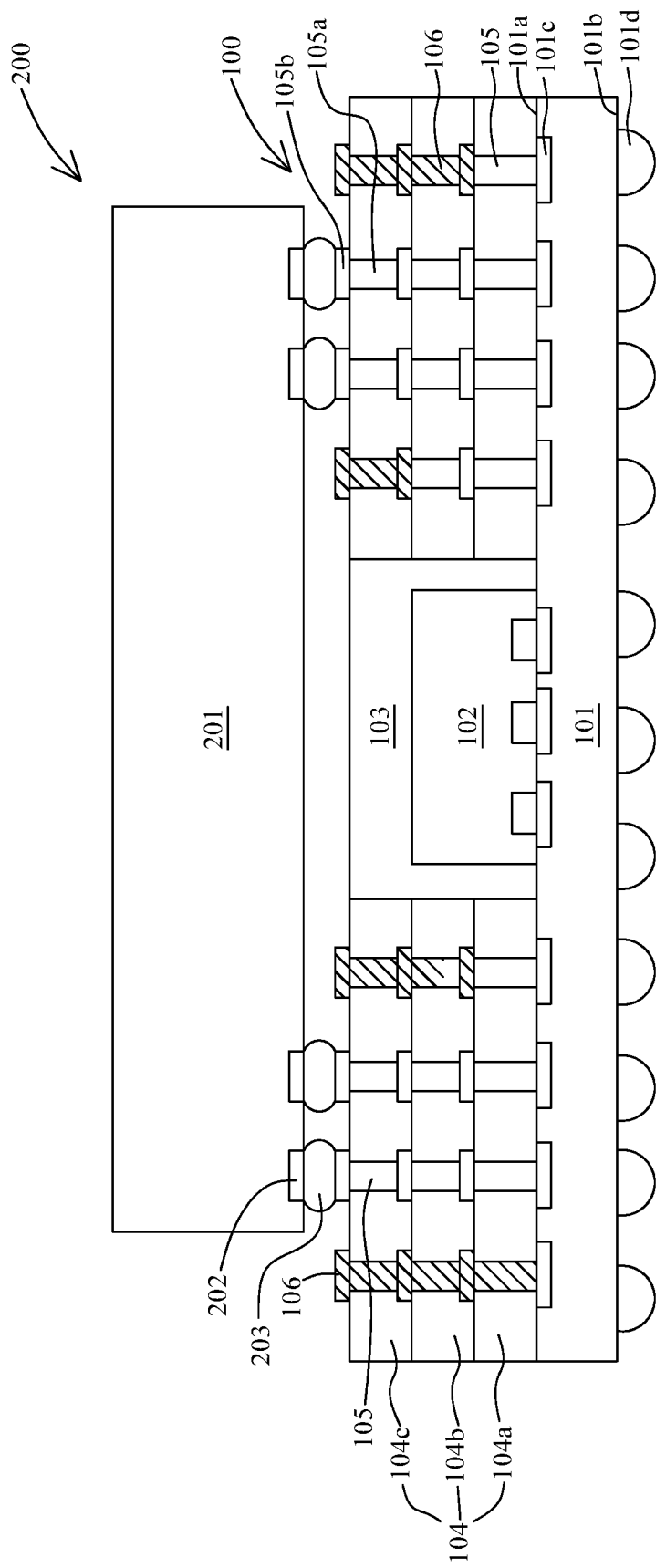

In some embodiments, a package is bonded over the die 102 and the dielectric layer 104 as shown in FIG. 17. In some embodiments, a package substrate 201 is bonded to the dielectric layer 104 and the die 102 by a second connector 203. In some embodiments, a second conductive pad 202 disposed over the package substrate 201 and the conductive via 105 is electrically connected through the second connector 203. The second connector 203 is disposed between the second conductive pad 202 and the conductive via 105.

In some embodiments, the package substrate 201 is electrically connected to the substrate 101 through the second conductive pad 202, the second connector 203 and the conductive via 105. In some embodiments, the package substrate 201, the second conductive pad 202 and the second connector 203 are in configurations as described above or as shown in FIGS. 1 to 4. In some embodiments, a semiconductor structure 200 is formed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
 a substrate;
 a die disposed over the substrate;
 a molding surrounding the die;
 a dielectric layer disposed over the substrate and encircling the die and the molding along outer sidewalls and corners of the molding;
 a conductive via extending vertically through the dielectric layer; and
 a metallic strip extending vertically through the dielectric layer and extending horizontally along the outer sidewalls and corners of the molding to horizontally cover the outer sidewalls and corners of the molding.

2. The semiconductor structure of claim 1, wherein the die is enclosed by the metallic strip.

3. The semiconductor structure of claim 1, wherein a surface of the metallic strip is exposed through the dielectric layer.

4. The semiconductor structure of claim 1, wherein the molding is disposed between the die and the dielectric layer.

5. The semiconductor structure of claim 1, wherein the metallic strip is disposed at a corner or along an edge of the semiconductor structure.

6. The semiconductor structure of claim 1, wherein the metallic strip is disposed over the conductive via.

7. The semiconductor structure of claim 1, wherein the conductive via is disposed between the metallic strip and the die.

8. The semiconductor structure of claim 1, wherein the metallic strip is disposed between the die and the conductive via.

9. The semiconductor structure of claim 1, wherein a top cross section of the conductive via is substantially smaller than a top cross section of the metallic strip.

10. The semiconductor structure of claim 9, wherein the top cross section of the conductive via has a circular shape, and the top cross section of the metallic strip has a rectangular shape.

11. The semiconductor structure of claim 1, further comprising a first connector disposed under the substrate.

12. The semiconductor structure of claim 1, further comprising a package bonded over the die and the dielectric layer by a second connector.

13. The semiconductor structure of claim 12, wherein the second connector is disposed on and electrically connected to the conductive via.

* * * * *